(12) United States Patent
Lai et al.

(10) Patent No.: US 11,855,034 B2
(45) Date of Patent: Dec. 26, 2023

(54) ELECTRONIC DEVICE PACKAGE AND METHOD OF MANUFACTURING THE SAME

(71) Applicant: Advanced Semiconductor Engineering, Inc., Kaohsiung (TW)

(72) Inventors: Chung-Hung Lai, Kaohsiung (TW); Chin-Li Kao, Kaohsiung (TW); Chih-Yi Huang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 28 days.

(21) Appl. No.: 17/334,622

(22) Filed: May 28, 2021

(65) Prior Publication Data

US 2022/0384381 A1 Dec. 1, 2022

(51) Int. Cl.
| | |
|---|---|
| H01L 23/538 | (2006.01) |
| H01L 23/00 | (2006.01) |
| H01L 23/498 | (2006.01) |
| H01L 23/14 | (2006.01) |
| H01L 25/065 | (2023.01) |

(52) U.S. Cl.
CPC .............. *H01L 24/73* (2013.01); *H01L 23/14* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 25/0655* (2013.01); *H01L 2224/16014* (2013.01); *H01L 2224/16105* (2013.01); *H01L 2224/16165* (2013.01); *H01L 2224/16168* (2013.01); *H01L 2224/73204* (2013.01); *H01L 2924/1433* (2013.01); *H01L 2924/1434* (2013.01); *H01L 2924/1616* (2013.01); *H01L 2924/16251* (2013.01);

(Continued)

(58) Field of Classification Search
CPC ..... H01L 23/5386; H01L 24/16; H01L 24/05; H01L 24/08; H01L 24/13
See application file for complete search history.

(56) References Cited

U.S. PATENT DOCUMENTS

2001/0040280 A1* 11/2001 Funakura .............. H01L 21/563
257/679
2013/0200529 A1* 8/2013 Lin ..................... H01L 25/0655
257/E23.116

(Continued)

*Primary Examiner* — Michele Fan
(74) *Attorney, Agent, or Firm* — FOLEY & LARDNER LLP

(57) ABSTRACT

An electronic device package is provided. The electronic device package includes a redistribution layer (RDL), a first electronic component and an interconnector. The RDL includes a topmost circuit layer, and the topmost circuit layer includes a conductive trace. The first electronic component is disposed over the RDL. The interconnector is disposed between the RDL and the first electronic component. A direction is defined by extending from a center of the first electronic component toward an edge of the first electronic component, and the direction penetrates a first sidewall and a second sidewall of the interconnector, the second sidewall is farther from the center of the first electronic component than the first sidewall is, and the conductive trace is outside a projection region of the second sidewall.

13 Claims, 14 Drawing Sheets

(52) U.S. Cl.
CPC . *H01L 2924/182* (2013.01); *H01L 2924/3511* (2013.01); *H01L 2924/3512* (2013.01)

(56) References Cited

U.S. PATENT DOCUMENTS

| | | | | |
|---|---|---|---|---|
| 2016/0099197 | A1* | 4/2016 | Uematsu | H01L 23/5385 |
| | | | | 257/759 |
| 2018/0220528 | A1* | 8/2018 | Ikeda | H05K 1/05 |
| 2018/0350629 | A1* | 12/2018 | Liu | H01L 25/105 |
| 2019/0115319 | A1* | 4/2019 | Hiner | H01L 21/563 |
| 2021/0074682 | A1* | 3/2021 | Chen | H01L 24/50 |

* cited by examiner

ELECTRONIC DEVICE PACKAGE AND METHOD OF MANUFACTURING THE SAME

TECHNICAL FIELD

The present disclosure generally relates to an electronic device package and method of manufacturing the same.

BACKGROUND

In an electronic device package, organic dielectric material is used as underfill layer or dielectric layer to provide protection over a redistribution layer (RDL) and around interconnector such as conductive bump or the like. The protection of the organic material, however, deteriorates at a high temperature higher than its glass transition temperature. Therefore, the stress may damage the RDL.

SUMMARY

In some arrangements, an electronic device package includes an RDL, a first electronic component, and an interconnector disposed between the RDL and the first electronic component. The interconnector is inclined along a direction.

In some arrangements, an electronic device package includes an RDL, a first electronic component and an interconnector. The RDL includes a topmost circuit layer, and the topmost circuit layer comprises a conductive trace. The first electronic component is disposed over the RDL. The interconnector is disposed between the RDL and the first electronic component. A direction is defined by extending from a center of the first electronic component toward an edge of the first electronic component, and the direction penetrates a first sidewall and a second sidewall of the interconnector, the second sidewall is farther from the center of the first electronic component than the first sidewall is, and the conductive trace is outside a projection region of the second sidewall

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
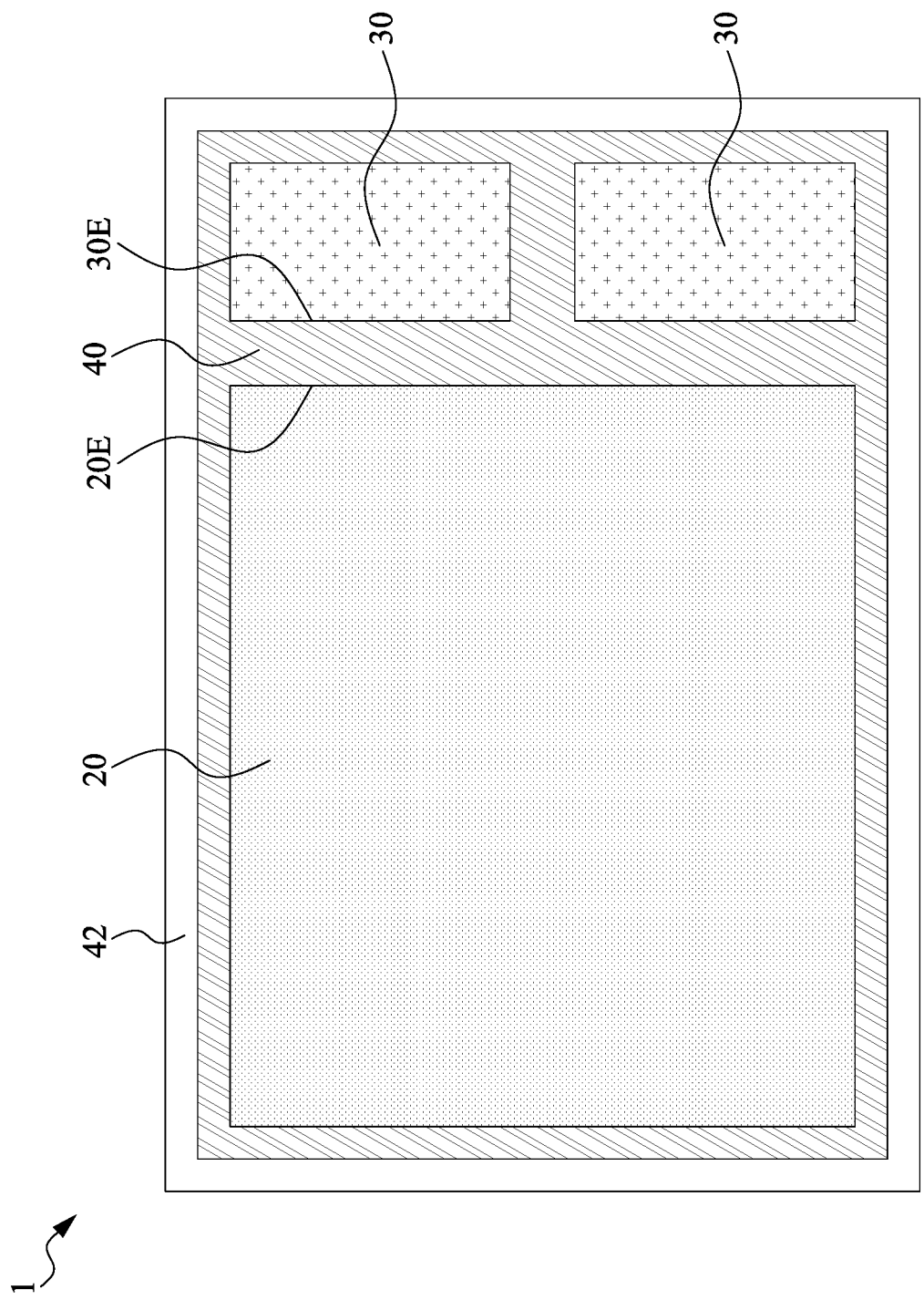
FIG. 1 is a schematic top view of an electronic device package in accordance with some arrangements of the present disclosure.

The following disclosure provides for many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various arrangements and/or configurations discussed.

Some arrangements, or examples, illustrated in the figures are disclosed below using specific language. It will nevertheless be understood that the arrangements and examples are not intended to be limiting. Any alterations and modifications of some of the disclosed arrangements, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various arrangements and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
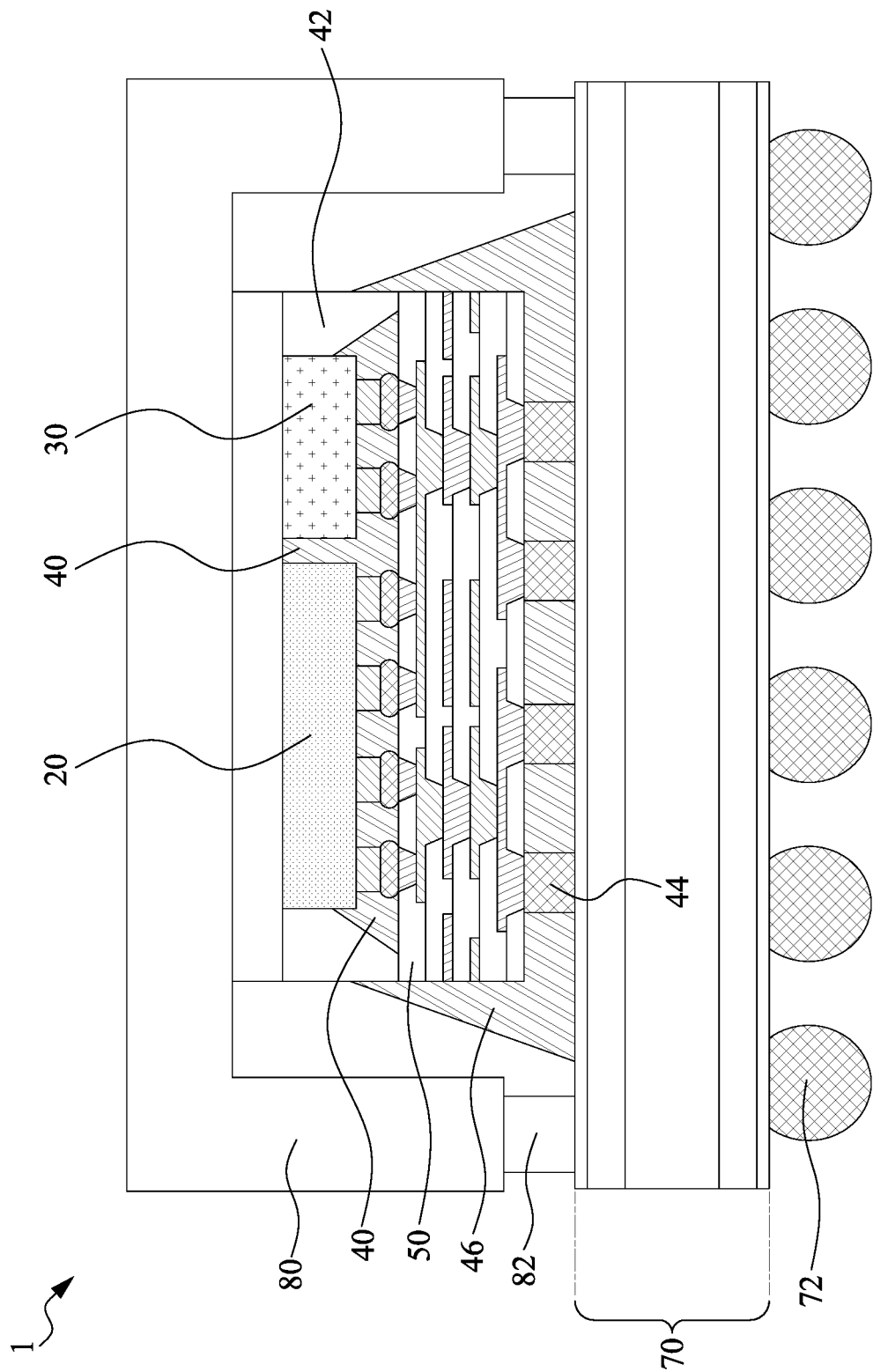
FIG. 1A is a schematic perspective view of the electronic device package in accordance with some arrangements of the present disclosure.
Figure 1B:
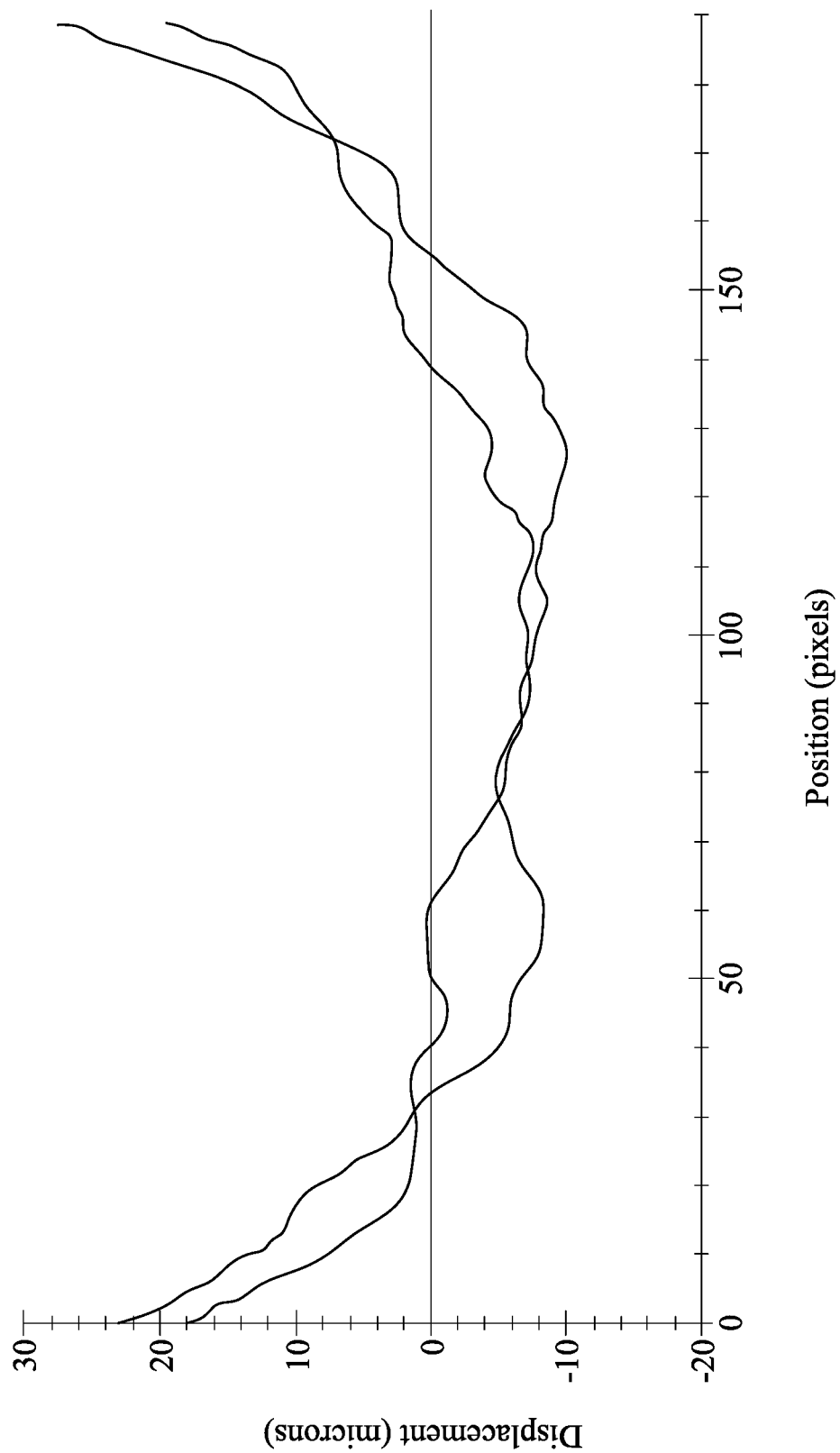
FIG. 1B depicts the displacement along a diagonal direction of the electronic device package.
Figure 1C:
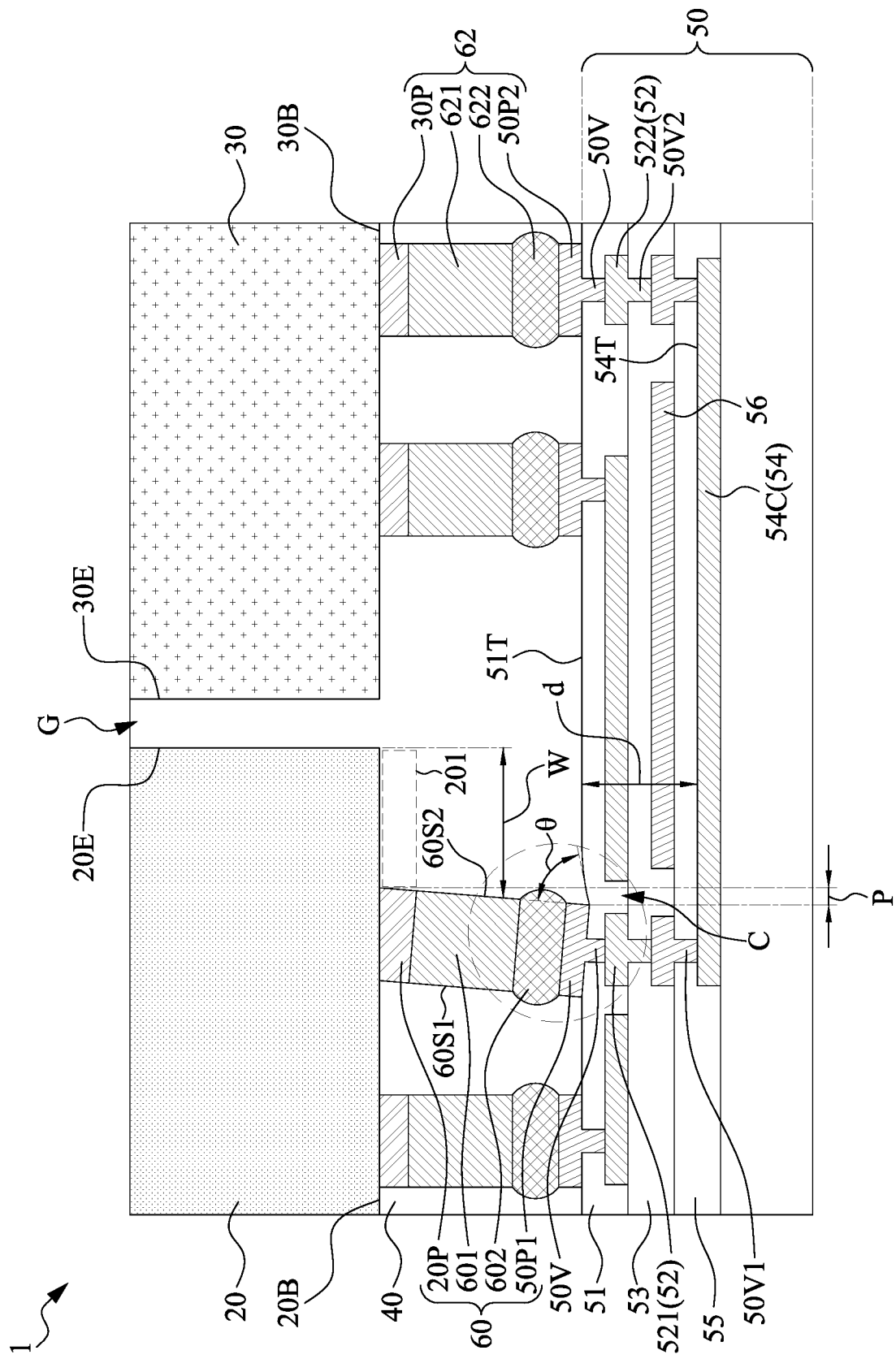
FIG. 1C is a schematic cross-sectional view of the electronic device package in accordance with some arrangements of the present disclosure.
Figure 1D:
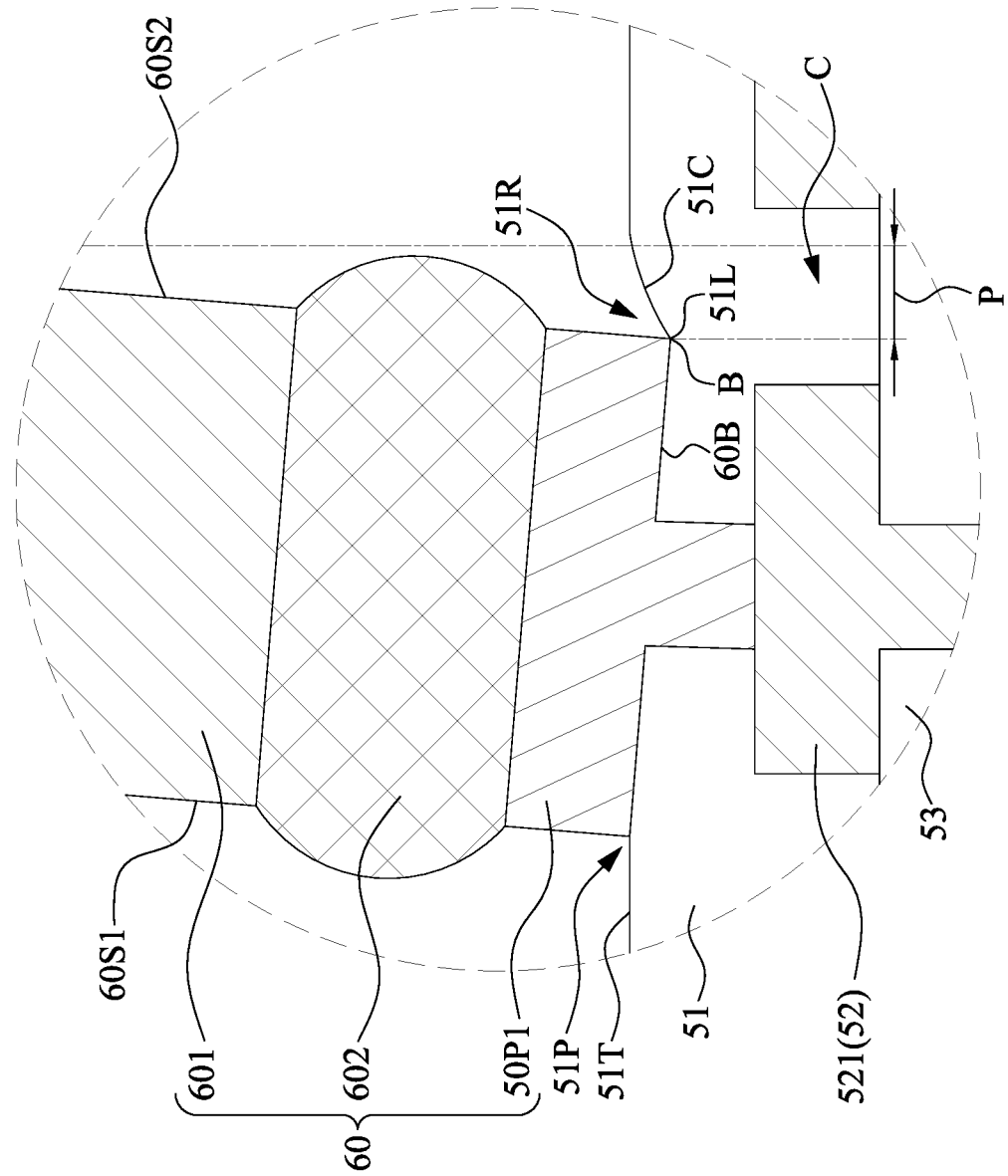
FIG. 1D is a schematic partial enlarged view of the electronic device package.

FIG. 1 is a schematic top view of an electronic device package 1 in accordance with some arrangements of the present disclosure. FIG. 1A is a schematic perspective view of the electronic device package 1 in accordance with some arrangements of the present disclosure. FIG. 1B depicts the displacement along a diagonal direction of the electronic device package 1. FIG. 1C is a schematic cross-sectional view of the electronic device package 1 in accordance with some arrangements of the present disclosure. FIG. 1D is a schematic partial enlarged view of the electronic device package 1. As shown in FIG. 1, FIG. 1A, FIG. 1B, FIG. 1C and FIG. 1D, the electronic device package 1 includes a redistribution layer (RDL) 50, a first electronic component 20, and interconnectors 60. The interconnectors 60 are disposed between the RDL 50 and the first electronic component 20. In some arrangements, the RDL 50 may include a plurality of circuit layers and a plurality of dielectric layers alternately stacked. By way of example, the RDL 50 may include a first dielectric layer (also referred to as a topmost dielectric layer) 51, a first circuit layer (also referred to as a topmost circuit layer) 52 under the first dielectric layer 51, a second dielectric layer 53 under the first circuit layer 52, and a second circuit layer 54 under the second dielectric layer 53. In some arrangements, the RDL 50 may further include a third circuit layer 56 between the first circuit layer 52 and the second circuit layer 54, and a third dielectric layer 55 between the second circuit layer 54 and the third circuit layer 56. The first circuit layer 52, the second circuit layer 54 and the third circuit layer 56 may be electrically connected through conductive vias 50V1 and conductive vias 50V2. Examples of the material of the first circuit layer 52, the second circuit layer 54, and the third circuit layer 56 may include metal such as copper or other suitable metal or alloy. The material of the first dielectric layer 51 and the second dielectric layer 53 may include organic material such as polyimide.

The first electronic component 20 may include a semiconductor die such as an application specific integrated circuit (ASIC). The first electronic component 20 may include other active and/or passive electronic component. In some arrangements, the electronic device package 1 may further include one or more second electronic components 30. In some arrangements, two second electronic components are disposed along the edge 20 E of the first electronic components 20, and respectively correspond to two corners of the first electronic components 20. The second electronic component 30 may include a semiconductor die such as a memory die. The second electronic component 30 may include other active and/or passive electronic component. The first electronic component 20 and the second electronic component 30 may be disposed side-by-side over the RDL 50 (e.g., in some examples, having their centers, top surfaces, bottom surfaces, and/or any two points align in an axis or surface that is parallel to a surface of the RDL 50, the surface of the RDL 50 facing the first electronic component 20 and the second electronic component 30). The first electronic component 20 includes a bottom surface 20B facing the RDL 50. The second electronic component 30 includes a bottom surface 30B facing the RDL 50. The first electronic component 20 and the second electronic component 30 each includes an edge 20E and an edge 30E facing each other, and in some examples, separated by a gap G. In some arrangements, the gap G is less than about 200 micrometers. In some examples, the first electronic component 20 and the second electronic component 30 are different in many aspects such as in dimensions and/or functionalities, and thus stress across the first electronic component 20 and the second electronic component 30 may be different.

The interconnectors 60 are disposed between the RDL 50 and the first electronic component 20. The interconnectors 60 are configured to electrically connect the RDL 50 to the first electronic component 20, and vice versa. In some arrangements, the electronic device package 1 further includes interconnectors 62 disposed between the RDL 50 and the second electronic component 30. The interconnectors 62 are configured to electrically connect the RDL 50 to the second electronic component 30, and vice versa.

Figure 5:
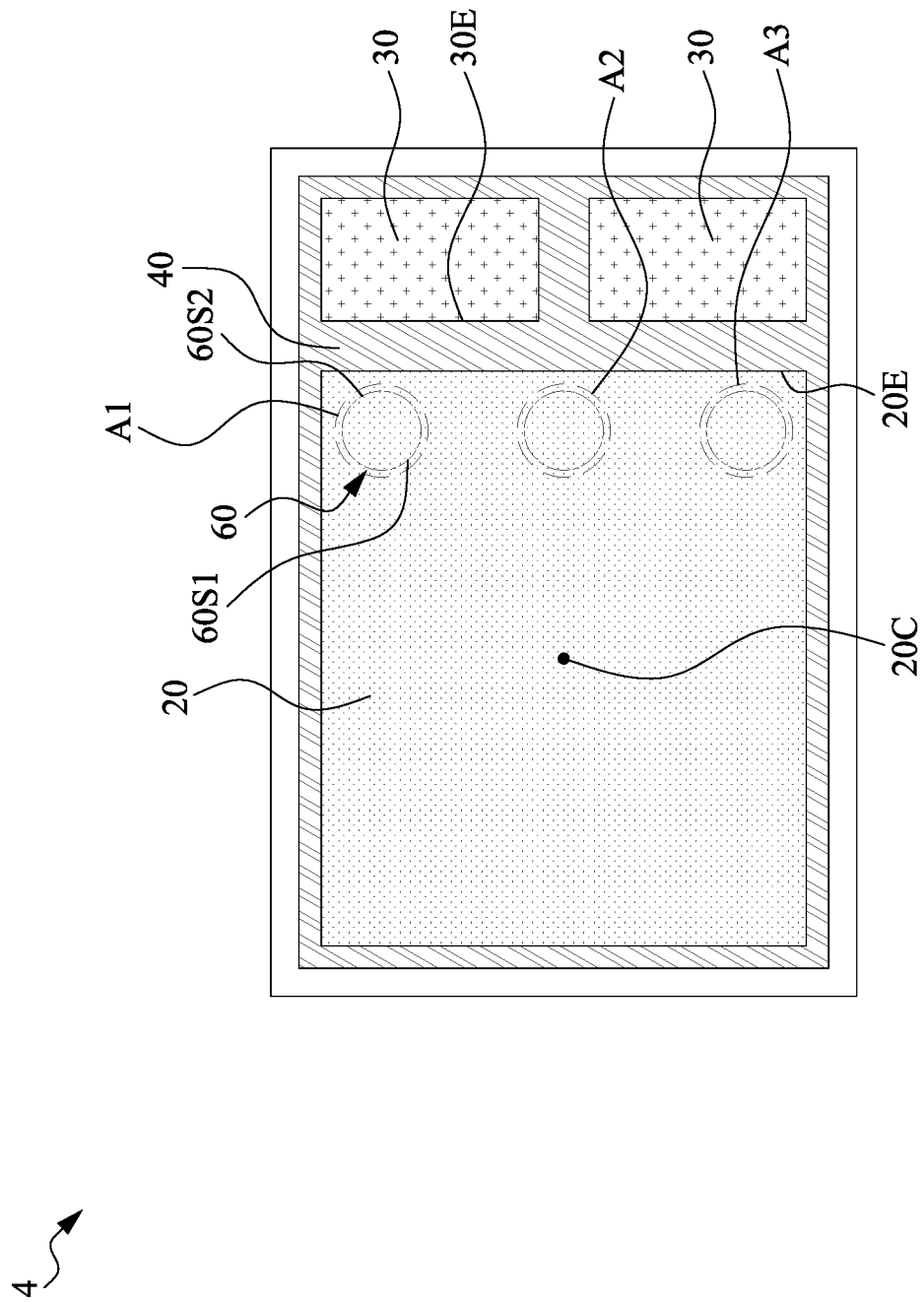
FIG. 5 is a schematic top view of the electronic device package in accordance with some arrangements of the present disclosure.
Figure 5A:
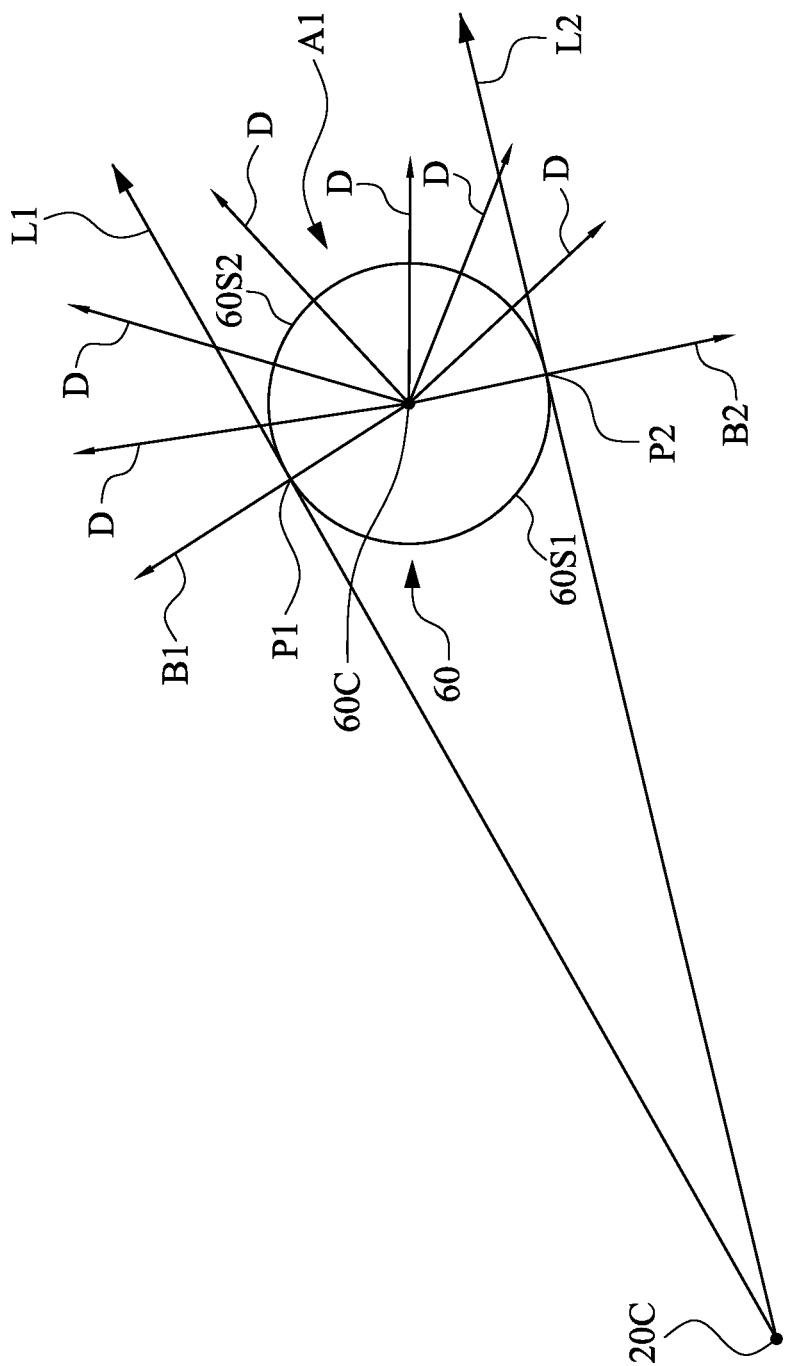
FIG. 5A is a schematic partial enlarged view of the electronic device package.

Each interconnector 60 includes a first sidewall 60S1 and a second sidewall 60S2 opposite to the first sidewall 60S1. The second sidewall 60S2 is closer to the center 20E of the first electronic component 20 and the gap G than the first sidewall 60S1 is. In other words, the second sidewall 60S2 is farther from the center 20C of the first electronic component 20 and the gap G than the first sidewall 60S1, for example, as shown in FIG. 5A. In some arrangements, at least one of the interconnectors 60 is inclined along a direction D. The direction D is toward the second electronic component 30. In some arrangements, the sidewall 60S2 of the interconnector 60 and an upper surface 51T of the RDL 50 have an included angle θ less than 90 degrees. The interconnector 60 includes a bottom surface 60B contacting the RDL 50, the sidewall 60S2 and the bottom surface 60B of the interconnector 60 include an intersection B as shown in FIG. 1D. Alternatively, the sidewall 60S2 of the interconnector 60 and an upper surface 51T of the RDL 50 include an intersection B. The first circuit layer (e.g., the topmost circuit layer) 52 is outside a region projected by the intersection B as shown in FIG. 1C and FIG. 1D. In some arrangements, the first circuit layer (e.g., the topmost circuit layer) 52 is outside a region P projected by the sidewall 60S2 of the interconnector 60. In some examples, one or more of the sidewalls 60S1 and 60S2 are oblique with respect to one or more of the surface 20B, the edge 20E, the edge 30E, the surface 30B, a surface of the first dielectric layer 51 facing the interconnector 6, and sidewalls of another interconnector 60.

For example, the direction D substantially extends from a center 20C of the first electronic component 20 toward the edge 20E of the first electronic component 20, and the direction D penetrates the interconnector 60 as illustrated in FIG. 5A. In some arrangements, a first imaginary tangent line L1 is defined by the center 20C of the first electronic component 20 and a first point P1 of a perimeter of the interconnector 60. A second imaginary tangent line L2 is defined by the center 20C of the first electronic component 20 and a second point P2 of the perimeter of the interconnector 60. The direction D may be substantially in a range between a first boundary B1 extending from a center 60C of the interconnector 60 toward the first point P1 and a second boundary B2 extending from the center 60C of the interconnector 60 toward the second point P2. In some arrangements, the first circuit layer (the topmost circuit layer) 52 may be disposed outside a region defined from the first boundary B1 to the second boundary B2 as shown in FIG. 5A.

In some arrangements, each of the interconnectors 60 may include a stack of multiple conductive components. By way of example, the interconnector 60 includes a bonding pad 50P1, a solder material 602, a conductive bump 601 and a die pad 20P of the first electronic component 20. In some arrangements, the interconnector 62 includes a stack of multiple conductive components. By way of example, the interconnector 602 includes a bonding pad 50P2, a solder material 622, a conductive bump 621 and a die pad 30P of the second electronic component 30. The first electronic component 20 is electrically connected to the second electronic component 30 through the interconnector 60, the conductive trace 54T of the RDL 50 and the interconnector 62. In some arrangements, the first circuit layer 52 may be electrically connected to the bonding pads 50P1 and 50P2 through conductive vias 50V.

The electronic device package 1 may include an underfill layer 40 disposed in the gap G. The underfill layer 40 may be further disposed between the first electronic component 20 and the first dielectric layer 51, and between the second electronic component 30 and the first dielectric layer 51. The electronic device package 1 may further include an encapsulation layer 42 encapsulating the first electronic component 20, the second electronic component 30 and the underfill layer 40. The properties of the underfill layer 40 and the first dielectric layer 51 are different. For example, the glass transition temperature of the first dielectric layer 51 is larger than that of the underfill layer 40. In some arrangements, a Young's modulus of the first dielectric layer 51 is less than that of the underfill layer 40. That is, the first dielectric layer 51 is softer than the underfill layer 40, particularly at high temperature. In some arrangements, the glass transition temperature of the underfill layer 40 is about 140° C., and the Young's modulus of the underfill layer 40 at 140° C. is less than 1 GPa. In some arrangements, the glass transition temperature of the first dielectric layer 51 is about 210° C., and the Young's modulus of the first dielectric layer 51 at 210° C. is less than 0.1 GPa.

During the fabrication, the electronic device package 1 may undergo a thermal process such as a reflow process of the solder material 602 and 622, and the temperature of the thermal process may be higher than 260° C. Under such a high temperature circumstance, the underfill layer 40 and the first dielectric layer 51 are both soften, and incapable of providing support and protection to the electronic device package 1. Accordingly, the electronic device package 1 may be warped, and the interconnector 60 is inclined. According to simulation result, the stress is the main factor that causes displacement of the electronic device package 1. FIG. 1B is a simulation result showing that the largest displacement occurs near the edge 20 E of the first electronic component 20. The stress thus causes the interconnector 60 incline along the direction D, and may damage the underneath RDL 50. According to simulation result, in case the width W of an overhang region 201 (i.e., a distance between the edge 20E and the second sidewall 60S2) is less than 500 micrometers, the stress would cause damage to the RDL 50 under the second sidewall 60S2 within a depth of about 15 micrometers. This zone under the inclined second sidewall 60S2 can be defined as a keep out zone (KOZ).

To be away from the KOZ, the RDL 50 includes a conductive trace 54C electrically connecting the first electronic component 20 to the second electronic component 30. The conductive trace 54C is a portion of the second circuit layer 54, which is under the first dielectric layer 51 and outside the KOZ. By way of example, in case the depth of the KOZ is 15 micrometers, the distance d between the conductive trace 54C and the upper surface 51T of the first dielectric layer 51 is larger than 15 micrometers. Accordingly, the conductive trace 54C is away from the KOZ in a depth direction, and can be disposed in a region P projected by the sidewall 60S2 of the interconnector 60. In some arrangements, the first circuit layer 52 may include a first trace section 521 disposed under the first die pad 20P and electrically connected to the first die pad 20P, and a second trace section 522 disposed under the second die pad 30P and electrically connected to the second die pad 30P.

As shown in FIG. 1A, the electronic device package 1 may further include a substrate 70. The RDL 50 may be bonded to the substrate 70 through electrical conductors 44 such as solder bumps or solder balls, and another underfill layers 46 may be disposed to protect the electrical conductors 44. In some arrangements, a protection cap 80 may be bonded on the substrate 70 through adhesives 82 to protect the first electronic component 20 and the second electronic component 30. Electrical conductors 72 such as solder balls may be formed on the other surface of the substrate 70 for electrically connecting to a printed circuit board (PCB).

In some arrangements of the present disclosure, the RDL 50 of the electronic device package 1 is designed to keep the conductive trace 54C, which is configured to connect the first electronic component 20 and the second electronic component 30, away from the keep out zone (KOZ), such that the crack issue of the RDL 50 can be avoided.

The electronic device package and manufacturing methods of the present disclosure are not limited to the above-described arrangements, and may be implemented according to other arrangements. To streamline the description and for the convenience of comparison between various arrangements of the present disclosure, similar components of the following arrangements are marked with same numerals, and may not be redundantly described.

Figure 2:
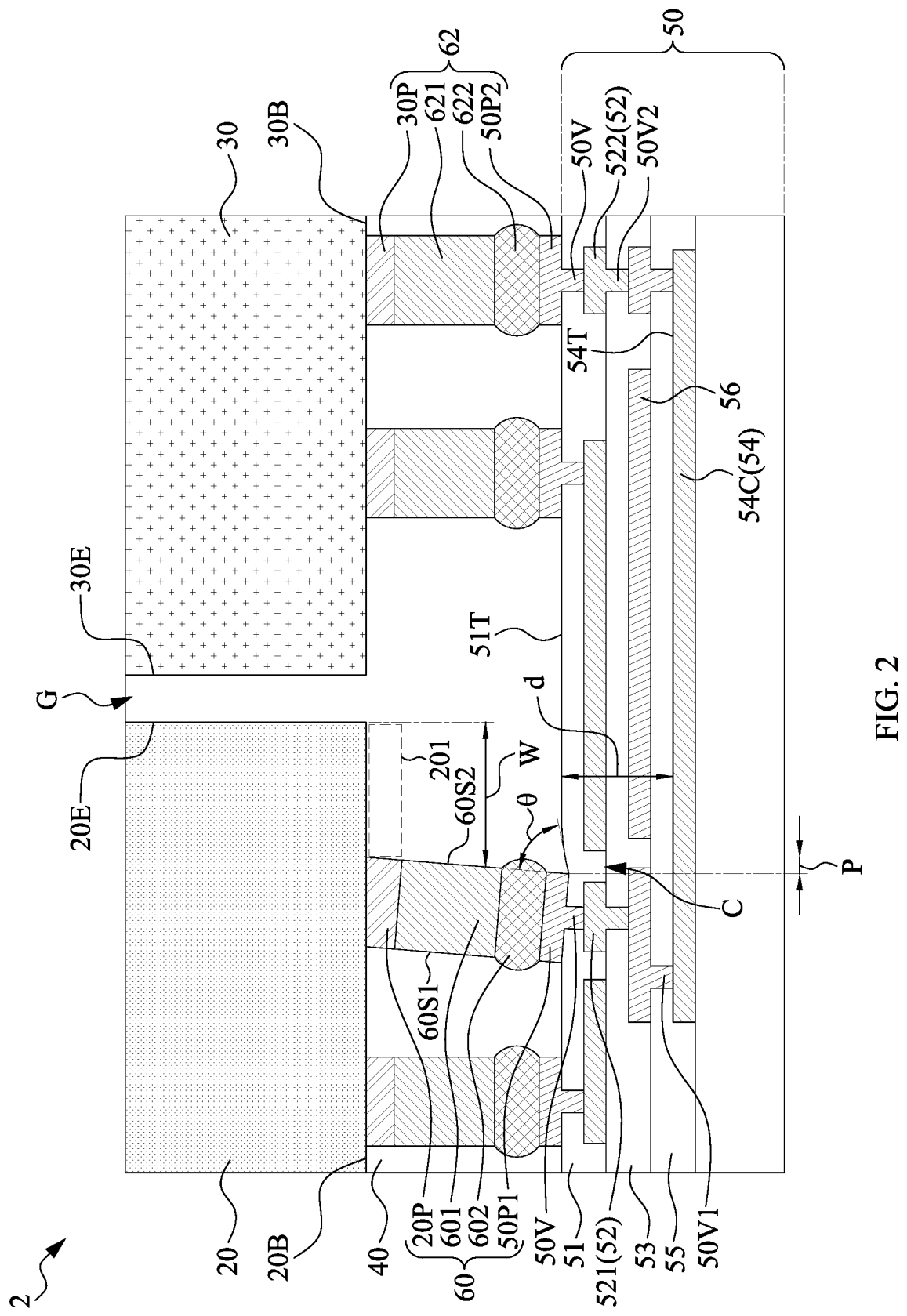
FIG. 2 is a schematic cross-sectional view of an electronic device package in accordance with some arrangements of the present disclosure.

FIG. 2 is a schematic cross-sectional view of an electronic device package 2 in accordance with some arrangements of the present disclosure. As shown in FIG. 2, in contrast to the electronic device package 1, the conductive via 50V1 of the electronic device package 2 is shifted to be away from the KOZ, which may further reduce the crack risk of the RDL 50.

Figure 3:
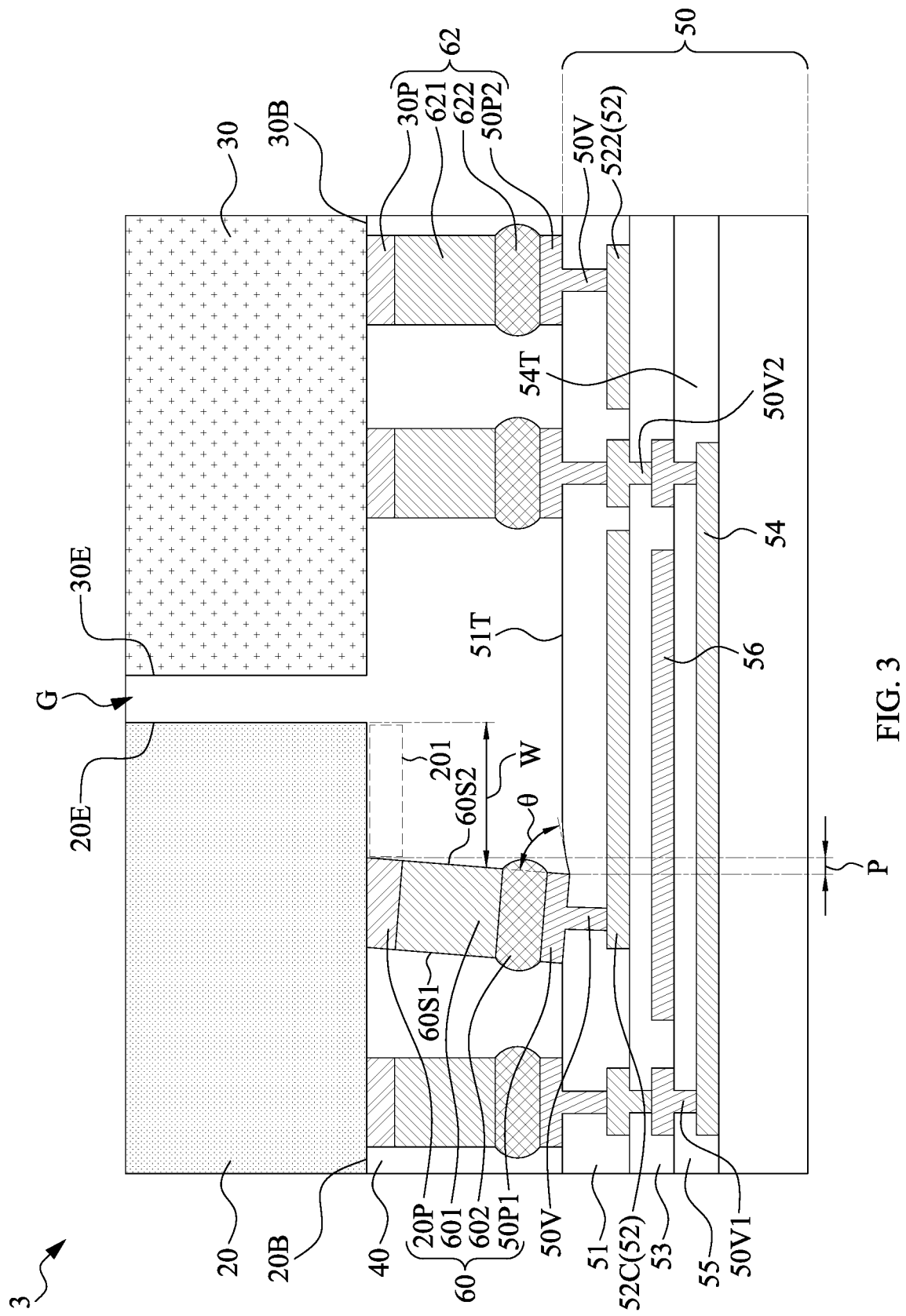
FIG. 3 is a schematic cross-sectional view of an electronic device package in accordance with some arrangements of the present disclosure.

FIG. 3 is a schematic cross-sectional view of an electronic device package 3 in accordance with some arrangements of the present disclosure. The electronic device package 3 is similar to the electronic device package 1. As shown in FIG. 3, in contrast to the electronic device package 1, a thickness of the first dielectric layer (the topmost dielectric layer) 51 is larger than a thickness of the second dielectric layer 53. The conductive trace 52C connecting the first electronic component 20 and the second electronic component 30 may be a portion of the first circuit layer (the topmost circuit layer) 52. The thickened first dielectric layer 51 can keep the conductive trace 52C away from the KOZ in a depth direction, which may reduce the crack risk of the RDL 50.

Figure 4:
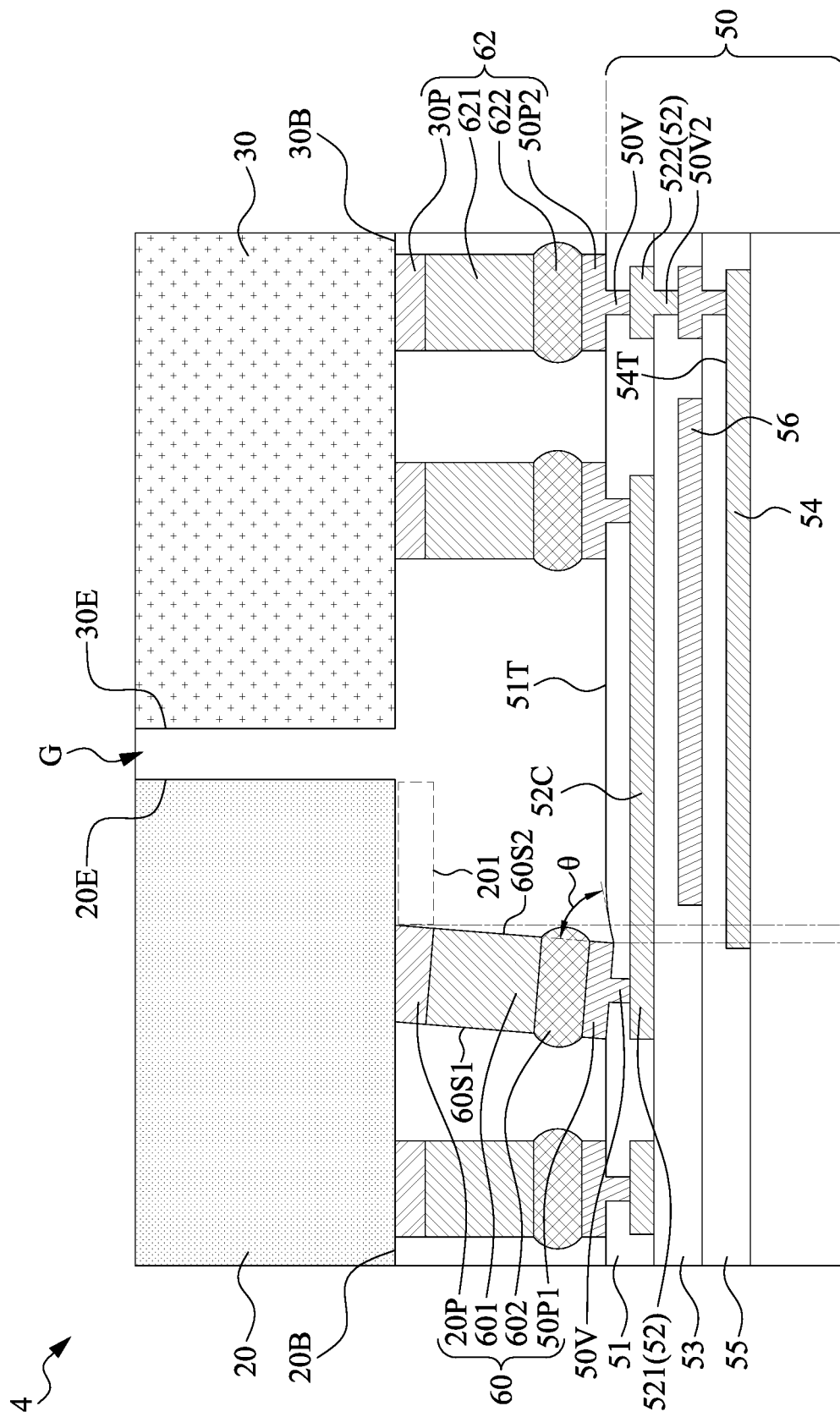
FIG. 4 is a schematic cross-sectional view of an electronic device package in accordance with some arrangements of the present disclosure.
Figure 5B:
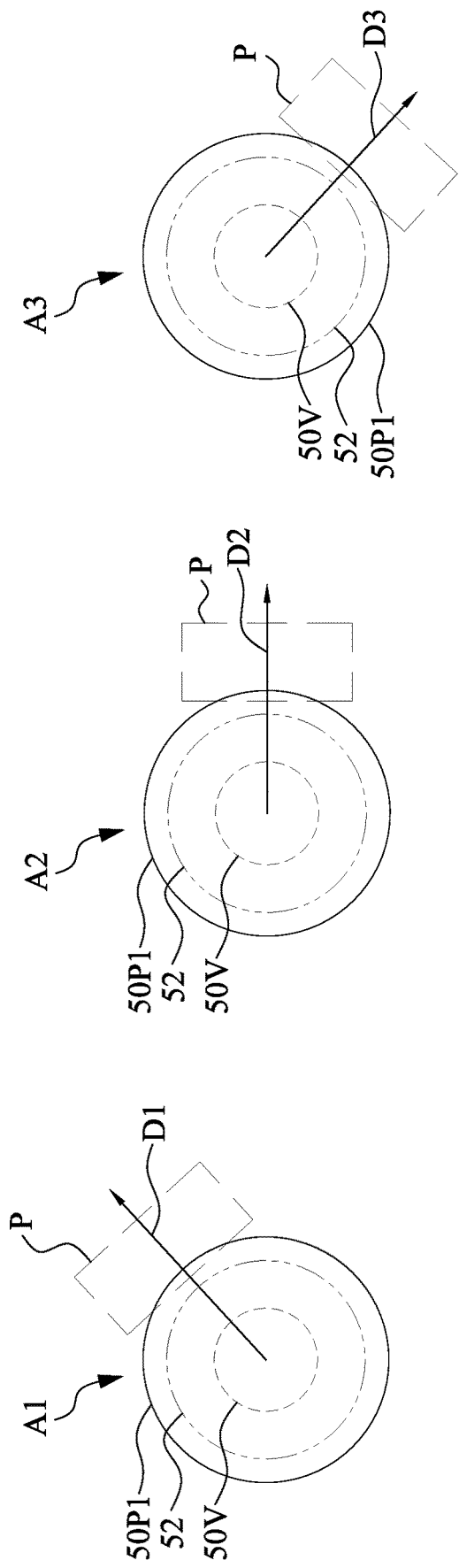
FIG. 5B is a schematic partial enlarged view of region A1, A2 and A3 of the electronic device package.
Figure 5C:
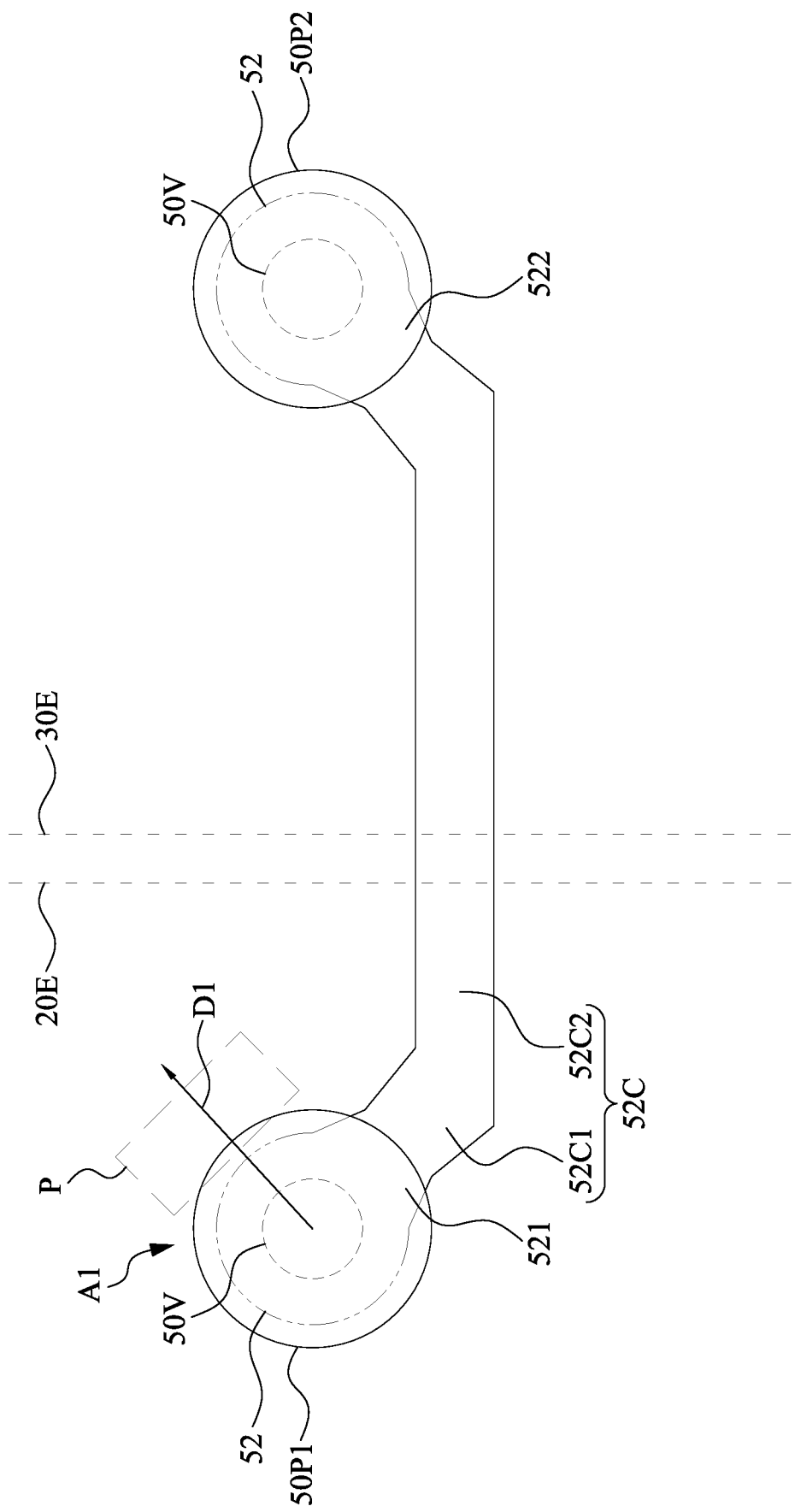
FIG. 5C is a schematic partial enlarged view of region A1 of the electronic device package.
Figure 5D:
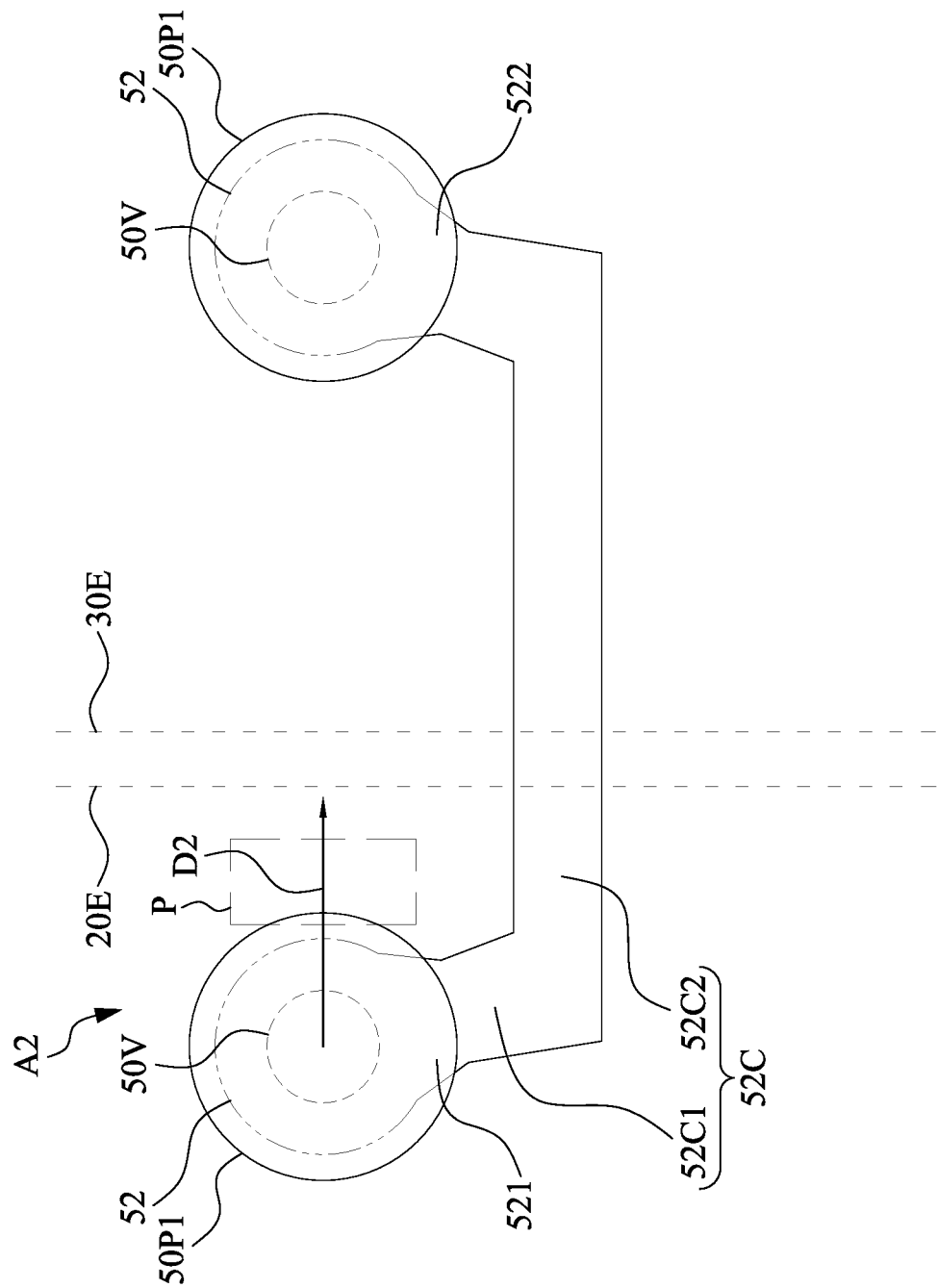
FIG. 5D is a schematic partial enlarged view of region A2 of the electronic device package.
Figure 5E:
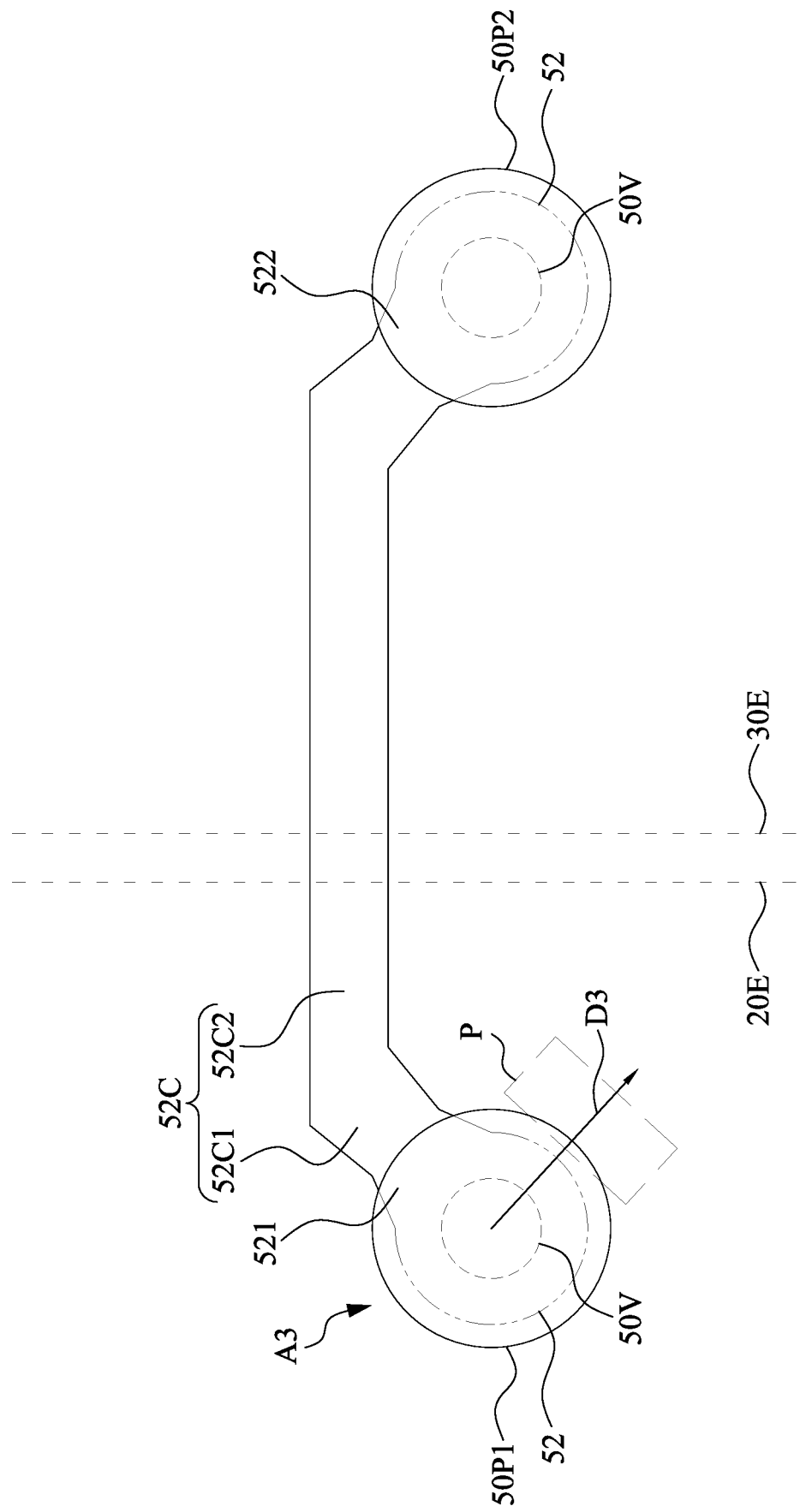
FIG. 5E is a schematic partial enlarged view of region A3 of the electronic device package.

FIG. 4 is a schematic cross-sectional view of an electronic device package 4 in accordance with some arrangements of the present disclosure. FIG. 5 is a schematic top view of the electronic device package 4 in accordance with some arrangements of the present disclosure, FIG. 5A is a schematic partial enlarged view of the electronic device package 4, FIG. 5B is a schematic partial enlarged view of region A1, A2 and A3 of the electronic device package 4, FIG. 5C is a schematic partial enlarged view of region A1 of the electronic device package 4, FIG. 5D is a schematic partial enlarged view of region A2 of the electronic device package 4, and FIG. 5E is a schematic partial enlarged view of region A3 of the electronic device package 4. The electronic device package 4 is similar to the electronic device package 1. To be highlight the features of the electronic device package 4, some components may be omitted for brevity.

The electronic device package 4 includes an RDL 50 including a conductive trace 52C, a first electronic component 20 disposed over the RDL 50, and interconnectors 60 disposed between the RDL 50 and the first electronic component 20. The interconnector 60 is inclined along a direction D. The direction D is defined by extending from a center 20C of the first electronic component 20 toward an edge 20E of the first electronic component 20. The direction D penetrates a first sidewall 60S1 and a second sidewall 60S2 of the interconnector 60, the second sidewall 60S2 is farther from the center 20C of the first electronic component 20 than the first sidewall 60S1 is. The conductive trace 52C is outside a projection region P of the second sidewall 60S2. It is contemplated the interconnectors 60 at different locations may incline along different directions. By way of examples, the interconnectors 60 at different locations may substantially incline radially from the center 20C of the first electronic component 20. In some arrangements, the interconnector 60 at region A1 may incline substantially along a direction D1 extending from the center 20C toward an upper right corner of the first electronic component 20. The interconnector 60 at region A2 may incline substantially along a direction D2 extending from the center 20C toward a middle portion of the edge 20E of the first electronic component 20. The interconnector 60 at region A3 may incline substantially along a direction D3 extending from the center 20C toward a lower right corner of the first electronic component 20 as shown in FIG. 5 and FIG. 5B.

In contrast to the electronic device package 1, the conductive trace 52C of the RDL 50 of the electronic device package 4 is designed to be away from the KOZ in a horizontal direction. By way of example, the conductive trace 52C may be a portion of the first circuit layer 52, which may be closer to the upper surface 51T of the first dielectric layer 51 than the conductive trace 54C of the electronic device package 1. As shown in FIG. 1C, FIG. 5 and FIG. 5C, the RDL 50 includes a conductive trace 52, and the conductive trace 52C at region A1 is outside a projection region P of the second sidewall 60S2. In some arrangements, the connection trace line 52C includes a first connection section 52C1, and a second connection section 52C2 connected to and angled with the first connection section 52C1. The first connection section 52C1 and the second connection section 52C2 are configured to avoid the KOZ in the horizontal direction, and thus the crack risk of the RDL 50 can be reduced. As shown in FIG. 1C, FIG. 5 and FIG. 5D, the RDL 50 includes a conductive trace 52, and the conductive trace 52C at region A2 is outside a projection region P of the second sidewall 60S2. The first connection section 52C1 and the second connection section 52C2 of the conductive trace 52 at region A2 are arranged along different dictions from that of the conductive trace 52 at region A1. As shown in FIG. 1C, FIG. 5 and FIG. 5E, the RDL 50 includes a conductive trace 52, and the conductive trace 52C at region A3 is outside a projection region P of the second sidewall 60S2. The first connection section 52C1 and the second connection section 52C2 of the conductive trace 52 at region A3 are arranged along different dictions from that of the conductive trace 52 at region A1.

In some arrangements of the present disclosure, the RDL of the electronic device package is designed to be away from the keep out zone caused along a depth direction and/or a horizontal direction, and thus the crack issue of the RDL can be reduced.

In the description of some arrangements, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific arrangements thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device package, comprising:
   a redistribution layer (RDL);
   a first electronic component; and
   a first interconnector disposed between the RDL and the first electronic component, wherein the first interconnector is inclined with respect to an upper surface of the RDL,
   wherein a sidewall of the first interconnector and the upper surface of the RDL have a first included angle less than 90 degrees, the first interconnector comprises a bottom surface, the sidewall and the bottom surface of the first interconnector comprise an intersection, and the RDL comprises a topmost circuit layer that is outside a region projected by the intersection,
   wherein the topmost circuit layer is outside a region projected by the sidewall of the first interconnector,
   wherein the RDL comprises a first dielectric layer contacting the first interconnector, the first dielectric layer comprises a recessed portion in the region projected by the sidewall of the first interconnector, and the recessed portion is lower than an upper surface of the first dielectric layer, and
   wherein the first dielectric layer further comprises a protruded portion outside the region projected by the sidewall of the first interconnector, and the protruded portion is higher than the upper surface of the first dielectric layer.

2. The electronic device package according to claim 1, further comprising a second interconnector between the RDL and the first electronic component, wherein the first interconnector is closer to an edge of the first electronic component than the second interconnector is.

3. The electronic device package according to claim 2, wherein a sidewall of the second interconnector and the upper surface of the RDL have a second included angle different from the first included angle from a cross-sectional view.

4. The electronic device package according to claim 1, wherein the RDL comprises a trace section electrically connected to the first interconnector, and a portion of the trace section is under an upper surface of a topmost dielectric layer of the RDL.

5. The electronic device package according to claim 1, wherein the RDL comprises a first circuit layer and a second circuit layer below the first circuit layer, and the second circuit layer is outside the region projected by the intersection of the bottom surface and the sidewall of the first interconnector.

6. The electronic device package according to claim 1, wherein the first dielectric layer of the RDL is under a projection of the sidewall of the first interconnector and has a thickness decreasing toward a bonding pad of the first interconnector.

7. The electronic device package according to claim 1, further comprising a second electronic component disposed on the RDL, wherein the first interconnector is inclined along a direction toward the second electronic component.

8. The electronic device package according to claim 7, further comprising an underfill layer disposed in a gap between an edge of the first electronic component and an edge of the second electronic component.

9. The electronic device package according to claim 8, further comprising an encapsulation layer encapsulating the first electronic component, the second electronic component and the underfill layer.

10. The electronic device package according to claim 7, further comprising a second interconnector between the RDL and the first electronic component, wherein the first interconnector is closer to an edge of the second electronic component than the second interconnector is.

11. The electronic device package according to claim 10, wherein a width of a gap between the first electronic component and the second electronic component is less than a distance from an edge of the first electronic component to the first interconnector.

12. The electronic device package according to claim 1, further comprising an underfill layer, wherein the first dielectric layer of the RDL is disposed on the topmost circuit layer, the underfill layer is disposed between the first electronic component and the first dielectric layer of the RDL, and a Young's modulus of the first dielectric layer is less than that of the underfill layer.

13. The electronic device package according to claim 1, wherein the recessed portion comprises a curved surface.

* * * * *